(12) United States Patent
Liu et al.

(10) Patent No.: US 8,772,071 B2
(45) Date of Patent: Jul. 8, 2014

(54) METHOD OF MANUFACTURING THIN FILM SOLAR CELLS

(75) Inventors: Jun-Chin Liu, Hsinchu (TW); Yu-Hung Chen, Hsinchu (TW); Chien-Liang Wu, Hsinch (TW); Yu-Ru Chen, Hsinchu (TW); Yu-Ming Wang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/314,332

(22) Filed: Dec. 8, 2011

(65) Prior Publication Data

US 2013/0078755 A1 Mar. 28, 2013

(30) Foreign Application Priority Data

Sep. 26, 2011 (TW) .............................. 100134529 A

(51) Int. Cl.
*H01L 31/00* (2006.01)
*H01L 31/0224* (2006.01)
*H01L 21/00* (2006.01)

(52) U.S. Cl.
USPC .................. 438/69; 438/95; 438/48; 438/57; 257/E31.041

(58) Field of Classification Search
USPC ........ 438/48–98; 136/243–265; 257/414–470
See application file for complete search history.

(56) References Cited

U.S. PATENT DOCUMENTS

| | | | | |
|---|---|---|---|---|
| 4,225,408 A | * | 9/1980 | Barlow et al. | 438/72 |
| 4,754,544 A | * | 7/1988 | Hanak | 438/66 |
| 4,784,701 A | * | 11/1988 | Sakai et al. | 136/249 |
| 4,968,354 A | * | 11/1990 | Nishiura et al. | 136/244 |
| 4,981,525 A | * | 1/1991 | Kiyama et al. | 136/244 |
| 4,999,308 A | * | 3/1991 | Nishiura et al. | 438/80 |
| 5,348,589 A | * | 9/1994 | Arai et al. | 136/244 |
| 5,421,908 A | * | 6/1995 | Yoshida et al. | 136/244 |
| 5,626,686 A | * | 5/1997 | Yoshida | 136/244 |
| 5,733,381 A | * | 3/1998 | Ota et al. | 136/244 |
| 6,235,982 B1 | * | 5/2001 | Saitou | 136/244 |
| 6,459,032 B1 | * | 10/2002 | Luch | 136/244 |

(Continued)

FOREIGN PATENT DOCUMENTS

JP 1989124270 5/1989
JP 1991002283 A 1/1991

(Continued)

OTHER PUBLICATIONS

US Office Action of U.S. Appl. No. 13/407,557 dated May 22, 2013.

(Continued)

*Primary Examiner* — Seahvosh Nikmanesh
*Assistant Examiner* — Evren Seven
(74) *Attorney, Agent, or Firm* — Rabin & Berdo, P.C.

(57) ABSTRACT

A method for manufacturing thin film solar cells, includes forming a light permeable first electrode layer in the back light surface of a glass substrate, and formed in the first electrode layer a plurality of first openings for exposing a part of the back light surface therefrom; forming a photoelectric conversion layer on the first electrode layer and the exposed back light surface, and forming a plurality of second openings in the photoelectric conversion layer for exposing a part of the first electrode layer therefrom; and forming a glistening second electrode layer having a plurality of third openings formed therein, wherein the second electrode layer comprises a conductive colloid comprised of non-diffractive fillings and polymeric base material.

13 Claims, 2 Drawing Sheets

(56) References Cited

U.S. PATENT DOCUMENTS

| | | | |
|---|---|---|---|
| 6,858,461 B2* | 2/2005 | Oswald et al. | 438/68 |
| 6,916,981 B2* | 7/2005 | Matsui et al. | 136/250 |
| 7,906,415 B2* | 3/2011 | Li et al. | 438/488 |
| 8,138,004 B2* | 3/2012 | Sugawara et al. | 438/48 |
| 8,344,245 B2* | 1/2013 | Wu et al. | 136/256 |
| 2008/0129193 A1* | 6/2008 | Asabe et al. | 313/504 |
| 2010/0065115 A1* | 3/2010 | Yata | 136/256 |
| 2010/0101842 A1 | 4/2010 | Akiba et al. | |
| 2010/0218822 A1 | 9/2010 | Yamasaki et al. | |
| 2010/0233846 A1* | 9/2010 | Ohe et al. | 438/99 |
| 2011/0011443 A1* | 1/2011 | Yata et al. | 136/246 |
| 2011/0041889 A1* | 2/2011 | Murata | 136/244 |
| 2011/0094573 A1 | 4/2011 | Wu et al. | |
| 2011/0177644 A1* | 7/2011 | Yamamuka et al. | 438/57 |
| 2011/0180134 A1* | 7/2011 | Kim et al. | 136/256 |
| 2011/0250709 A1* | 10/2011 | Tachibana et al. | 438/17 |
| 2011/0284070 A1* | 11/2011 | Suzuki | 136/256 |
| 2011/0287568 A1* | 11/2011 | Suzuki et al. | 438/57 |
| 2012/0181503 A1* | 7/2012 | Lee et al. | 257/13 |
| 2012/0211060 A1* | 8/2012 | Ahn et al. | 136/251 |
| 2013/0098424 A1* | 4/2013 | Tsuda et al. | 136/244 |

FOREIGN PATENT DOCUMENTS

| | | |
|---|---|---|
| JP | 2010047649 A | 3/2010 |
| TW | 201115762 A | 5/2011 |
| TW | 201119048 A | 6/2011 |
| WO | WO-2005081324 A1 | 9/2005 |
| WO | WO-2009035112 A1 | 3/2009 |

OTHER PUBLICATIONS

Japan Patent Office, Office Action, Patent Application Serial No. JP2012010097 dated Sep. 2, 2013.

Taiwan Patent Office, Office Action, Patent Application Serial No. TW100134529, Dec. 12, 2013, Taiwan.

Japan Patent Office, Office Action, Patent Application Serial No. JP2012115899, Jul. 2, 2013, Japan.

* cited by examiner

US 8,772,071 B2

METHOD OF MANUFACTURING THIN FILM SOLAR CELLS

TECHNICAL FIELD

The invention relates to methods of manufacturing thin film solar cells and, in particular, to a method of manufacturing thin film solar cells with glistening back electrode layer.

BACKGROUND

In the conventional manufacturing process of thin film solar cells, as shown in FIGS. 1A-1G, a first electrode layer 11, e.g., a layer of TCO film, is sputtered on the backlight surface 101 of the glass substrate, and further patterning is carried out on the first electrode layer 11 by laser patterning to expose a part of the backlight surface 101 through the patterned openings.

After the step of patterning the first electrode layer 11 is finished, a photoelectric conversion layer 12 such as silicon film, is sputtered by vacuum sputtering process on the first electrode layer 11 and a part of the backlight surface 101 exposed through the patterned openings. Sequentially, laser patterning is conducted on the photoelectric conversion layer 12 to expose a part of the first electrode layer 11 in the formed patterned openings. After the step of patterning the photoelectric conversion layer 12, a glistening second electrode layer 13 can be sputtered on the photoelectric conversion layer 12 and a part of the exposed first electrode layer 11 through the patterned openings by vacuum sputtering once more. Finally, laser patterning is performed on the second electrode layer 13 and the photoelectric conversion layer 12, so as to expose a part of the first electrode layer 11 through the patterned openings, and accomplish the process of manufacturing the thin film solar cell.

However, the vacuum sputtering process demands expensive equipments, substantially raising the manufacturing cost, causing the total cost of the thin film solar cells unable to be effectively reduced. In addition, a preferred temperature used in the art for thin film solar cells is not beyond 150° C. so as for the cells not to be damaged at high temperature, but most of current sputtering equipment is accompanied by operating temperature as high as 200° C., such that the entire yield of thin film product is directly affected. Also, presently most of the second electrode layers 13 are silver electrodes; however, the silver electrode is unable to avoid surface plasmon absorption effect and affects efficacy of glistening. Under such circumstances, the total power generation efficiency of the thin film solar cell is not quite acceptable.

Moreover, Taiwan Patent Application Publication No. 201119048A1 disclosed a technique of using conductive ink fillings as back electrode of thin film solar cells. However, since the size of the conductive ink fillings is designed ranging from 0.5 nm to 300 nm, serious problems such as high scattering loss and surface plasma loss are inevitable, and thus reflectivity is unable to be raised.

SUMMARY

In view of various disadvantages of the prior art, one of the purposes of this disclosure is to provide a manufacturing process of thin film solar cell, reducing the use of vacuum sputtering equipment and the damage due to high temperature.

For obtaining the purpose and other purposes, a manufacturing process of thin film solar cell according to this disclosure which comprises the steps of: forming a light-permeable first electrode layer on a backlight surface of a glass substrate, and forming a plurality of first openings in the first electrode layer such that a part of the backlight surface is exposed through the first openings; forming a photoelectric conversion layer on the first electrode layer and the part of the backlight surface exposed through the first openings, and forming a plurality of second openings in the photoelectric conversion layer such that a part of the first electrode layer is exposed through the second openings; and forming a glistening second electrode layer having a plurality of the third openings, by non-vacuum coating process, on the photoelectric conversion layer and a part of the first electrode layer exposed through the second openings, wherein the second electrode layer includes conductive colloids comprised of non-diffractive fillings and polymeric base material.

DETAILED DESCRIPTION OF PREFERRED EMBODIMENTS

The following illustrate the implementing method of this disclosure by specific embodiments. Persons of ordinary skill in the art can easily understand the advantages and efficacy of this disclosure through the disclosed content in the specification. Of course, this disclosure may also be conducted or applies by other embodiments.

In an embodiment, the step of forming the second electrode layer by non-vacuum coating refers to forming the second electrode layer by screen printing, transfer printing or ink jet process. And the step of forming the second electrode layer by the screen printing, transfer printing or ink jet process refers to forming the second electrode layer by the screen printing, transfer printing or ink jet process under room temperature or temperature less than 120° C.

Compared to the prior art, this disclosure can directly form the second openings with the already-made third openings in the photoelectric conversion layer by screen printing, transfer printing or ink jet process. Therefore, not only times of using the vacuum sputtering equipment can be reduced, but also steps of the laser-patterning process, can be simplified. Accordingly, the cost of the process can be lowered, manufacturing efficiency can be improved, and damages due to high temperature can be avoided. Further, because the second electrode layer has the conductive colloids including polymeric base material and non-diffractive fillings, the conversion efficiency of photo electricity is further improved.

Referring to FIG. 2A to FIG. 2E, the schematic sequential diagrams are presented for understanding the process steps of manufacturing the thin film solar cell according to an embodiment of this disclosure. The manufacturing process according to this disclosure uses a glass substrate 20 as a base, for sequentially forming thereon a first electrode layer 21, a photoelectric conversion layer 22 and a second electrode layer 23.

Figure 1A:
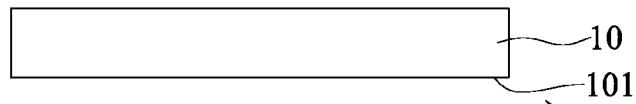
FIG. 1A to FIG. 1G is a schematic sequential diagrams of the process of manufacturing a thin film solar cell of the prior art; and FIG. 2A to FIG. 2E is a schematic sequential diagrams of the process steps of manufacturing a thin film solar cell according to this disclosure
Figure 1B:
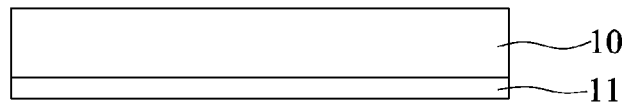
Figure 1C:
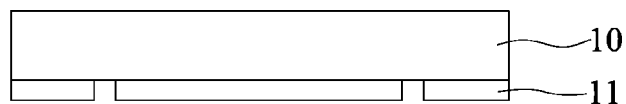
Figure 1D:
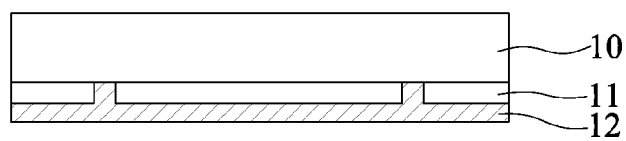
Figure 1E:
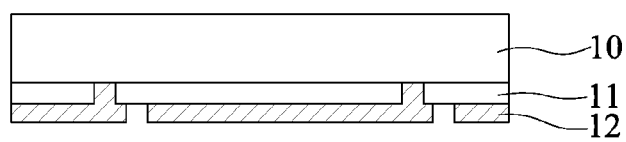
Figure 1F:
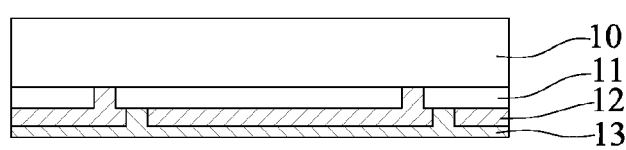
Figure 1G:
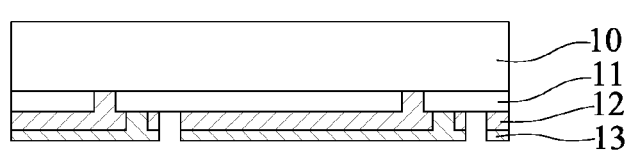
Figure 2A:
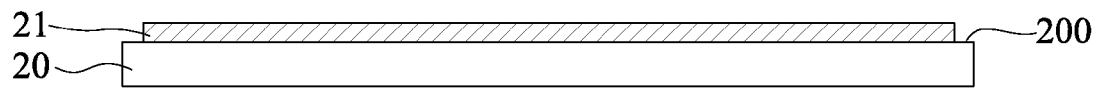
Figure 2B:
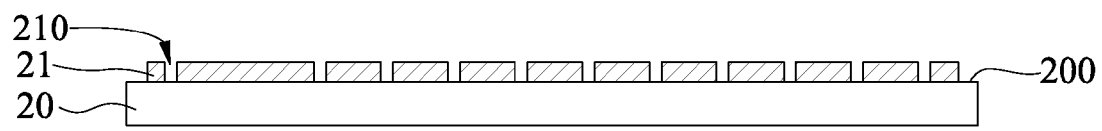

In the embodiment, as shown in FIG. 2A and FIG. 2B, a light-permeable first electrode layer 21 is formed on the backlight surface 200 of the glass substrate 20 and a plurality of first openings 210 (as shown in the drawing) are formed in the first electrode layer 21 for a part of the backlight surface 200 to be exposed through the first openings 210. In the present embodiment, the process of forming a plurality of the first openings in the first electrode layer 21 is performed by laser patterning, while the process of forming a light-permeable first electrode layer 21 can utilize commercially-available vacuum sputtering equipments for implementation, and no further description would be provided.

Figure 2C:
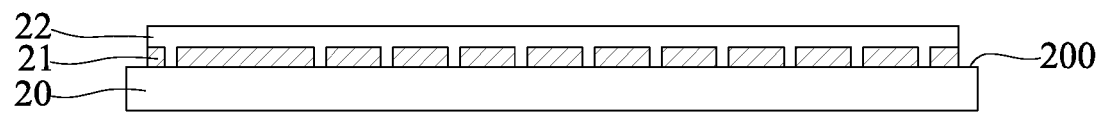
Figure 2D:
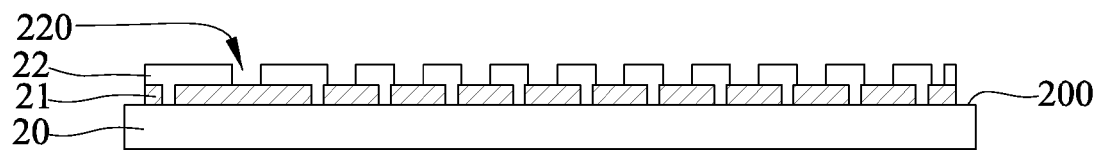

Next, as shown in FIG. 2C and FIG. 2D, a photoelectric conversion layer 22 is formed on the first electrode layer 21 and the exposed part of the backlight surface 200 through the first openings 210, and the photoelectric conversion layer 22 is formed with a plurality of second openings 220, for exposing a part of the first electrode layer 21 through the second openings 220. In the present embodiment, the process of forming a plurality of the second openings in the photoelectric conversion layer 22 can be performed by laser patterning process. Besides, the plurality of second openings 220 are formed at positions different from the first openings 210, as the first openings 210 are filled with the photoelectric conversion layer 22. Of course, the formation of the photoelectric conversion layer 22 can be alternatively accomplished by any vacuum sputtering equipments in the art, so detailed descriptions thereto is hereby omitted fro simplification.

Figure 2E:
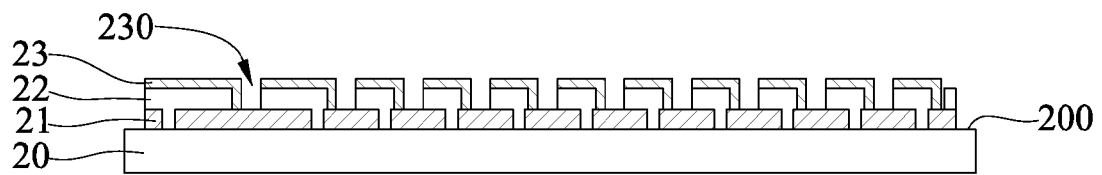

Finally as shown in FIG. 2E, a glistening second electrode layer 23 with a plurality of third openings 230 is formed on the photoelectric conversion layer 22 and the part of the first electrode layer 21 exposed through the second openings 220 by non-vacuum coating process. The second electrode layer 23 includes conductive colloids comprised of non-diffractive fillings and polymeric base material. The materials available for the conductive colloids are disclosed in both Taiwan Patent Application Publication No. 201115762A1 and Taiwan Patent Application No. 100128413, and thus detailed descriptions will not be provided herewith. In the present embodiment of this disclosure, the non-vacuum coating process refers to screen printing, transfer printing or ink jet process, and is preferably performed under room temperature or at temperature less than 120° C. In other words, the manufacturing process of forming the second electrode layer 23 needs not to utilize any sputtering equipment, thereby avoiding possible damage under high temperature and reducing the process cost. Because the screen printing, transfer printing and ink jet process are suitable for being used to form the second electrode layer 23 together with the third openings 230 simultaneously, laser patterning is no longer necessary for patterning the second electrode layer 23. Accordingly, the efficiency of the process is further improved and the cost of the process is reduced.

In another embodiment, the thickness of the second electrode layer 23 can be less than 20 um; the weight of the fillings of the conductive colloids in the second electrode layer 23, can be between 30% and 70% of the weight of the conductive colloids in the second electrode layer 23; the size of at least one of the dimensions of the fillings of the conductive colloids can be larger than or equal to $\lambda/2n$, wherein $\lambda$ is a wavelength of reflected light of the conductive colloid while n is the refractive index of the fillings. As an embodiment, the fillings are each in tube, line, rod or sheet shape. Of course, the fillings can be made of gold, silver, copper, aluminum or titanium in nanoscale. The polymeric base material can be acrylic resin, vinyl-vinyl acetate resin, epoxy, polyurethanes resin or cellulose.

In actual implementation, the fillings in the conductive colloids of the second electrode layer 23 can be silver sheets or nanoscale silver wires, wherein the characteristic length of the silver sheet is longer than $\lambda/2n$. For example, when the light has a wavelength of 600 nm, the characteristic length of the nano-material only needs to be longer than 300 nm for raising reflectivity. The wavelength of reflected light according to this disclosure can be between 400 nm and 1200 nm, so the characteristic length of the silver sheet can be between 0.5 μm and 16 μm. One of the size parameters of the nanoscale silver wire such as AR can be larger than 100 nm, where AR (Aspect Ratio)=L/D, and another dimension parameter such as D can approach 100 nm. By the embodiment in this disclosure, the size of silver sheet can be larger than the diffractive limit of the light beam, so the reflectivity of the light beam can be effectively raised. Meanwhile, the nanoscale silver wire can be connected to the silver sheet in periphery to increase the conductivity, thereby avoiding surface plasma loss and scattering loss due to the use of current ink. As supplements, the structural sizes, material species and the theory or concept of light diffraction limit can be collectively referred to Taiwan Patent Application Publication No. 201115762A1 and Taiwan Patent Application No. 100128413.

In view of the prior art, because this disclosure can directly and rapidly form the glistening second electrode layers with the plurality of third opening on the photoelectric conversion layer by screen printing, transfer printing or ink jet process, and the pattern-etched second electrode layer can be rapidly formed at room (i.e. ambient) temperature. The vacuum sputtering process and laser patterning process can be simplified, so as to reduce manufacturing cost, improve manufacturing efficiency, and avoid damages due to high temperature processes. Also, with the second electrode layer according to this disclosure having physical characteristics of the conductive colloids comprised of polymeric base material and non-diffractive fillings, total efficiency of reflected light of the thin film solar cell can be raised, avoiding disadvantages such as plasma loss and scattering loss can be avoided, and the conversion efficiency of photo electricity can be improved.

The embodiments herein only servers the purpose of illustratively explaining the theory and efficacy of this disclosure, rather than limiting this disclosure. Those having ordinary skill in art are able to modify or alter the embodiments without departing the spirit and scope of this disclosure. Accordingly, the protection scope of this disclosure should be that as the following claims.

What is claimed is:

1. A method for manufacturing a thin film solar cell, comprising:
    forming a light-permeable first electrode layer on a backlight surface of a glass substrate, and forming a plurality of first openings on the first electrode layer such that a part of the backlight surface is exposed through the first openings;
    forming a photoelectric conversion layer on the first electrode layer and the part of the backlight surface exposed through the first openings, and forming a plurality of second openings in the photoelectric conversion layer such that a part of the first electrode layer is exposed through the second openings; and
    simultaneously forming both
        a glistening second electrode layer, by a non-vacuum coating process, on the photoelectric conversion layer and a wall of each of the second openings, and
        a plurality of third openings in the glistening second electrode layer,
    wherein the non-vacuum coating process is a screen printing, transfer printing or ink jet process, the plurality of third openings expose the part of the first electrode layer through the second openings, and the second electrode layer includes conductive colloids comprised of non-diffractive filling material and polymeric base material.

2. The method for manufacturing the thin film solar cell of claim 1, wherein the step of forming the plurality of first openings in the first electrode layer is performed by a laser patterning process.

3. The method for manufacturing the thin film solar cell of claim 1, wherein the step of forming the plurality of second openings in the photoelectric conversion layer is performed by a laser patterning process.

4. The method for manufacturing the thin film solar cell of claim 1, wherein the step of forming the plurality of second openings in the photoelectric conversion layer is performed to form the plurality of second openings at a position different from the first openings in the photoelectric conversion layer.

5. The method for manufacturing the thin film solar cell of claim 1, wherein the step of forming the second electrode layer is performed by a screen printing, transfer printing or ink jet process at room temperature or less than 120° C.

6. The method for manufacturing the thin film solar cell of claim 1, wherein the plurality of third openings are of intervals between any two adjacent ones of the third openings less than 50 μm.

7. The method for manufacturing the thin film solar cell of claim 1, wherein the plurality of third openings are formed corresponding in position to the second openings.

8. The method for manufacturing the thin film solar cell of claim 1, wherein the second electrode layer is formed with a thickness less than 20 μm.

9. The method of manufacturing the thin film solar cell of claim 1, wherein a weight of the filling material is between 30% and 70% of that of the conductive colloid.

10. The method of manufacturing the thin film solar cell of claim 1, wherein a size of at least one of dimensions of a filling formed by the filling material is larger than or equal to $\lambda/2n$, while $\lambda$ is a wavelength of reflected light of the conductive colloid and n is refractive index of the fillings.

11. The method of manufacturing the thin film solar cell of claim 1, wherein the filling material is made of gold, silver, copper, aluminum or titanium.

12. The method of manufacturing the thin film solar cell of claim 11, wherein a characteristic length of a filling formed by the filling material ranges from 0.5 to 16 μm, while the filling material is made of silver.

13. A method for manufacturing a thin film solar cell, comprising:

forming a light-permeable first electrode layer on a backlight surface of a glass substrate, and forming a plurality of first openings on the first electrode layer such that a part of the backlight surface is exposed through the first openings;

forming a photoelectric conversion layer on the first electrode layer and the part of the backlight surface exposed through the first openings, and forming a plurality of second openings in the photoelectric conversion layer such that a part of the first electrode layer is exposed through the second openings; and simultaneously performing the following, coating a glistening second electrode layer on a top and a side surface of the photoelectric conversion layer, and forming a plurality of third openings in the glistening second electrode layer, so that a side wall of the photoelectric conversion layer is exposed and the second openings are maintained.

* * * * *